United States Patent
Wilson et al.

(10) Patent No.: US 9,202,519 B2
(45) Date of Patent: Dec. 1, 2015

(54) ADAPTIVE CALIBRATION OF NOISE PREDICTIVE FINITE IMPULSE RESPONSE FILTER BASED ON DECODER CONVERGENCE

(71) Applicant: LSI Corporation, San Jose, CA (US)

(72) Inventors: Bruce A. Wilson, San Jose, CA (US); Haitao Xia, San Jose, CA (US); Seongwook Jeong, Sunnyvale, CA (US); Weijun Tan, Longmont, CO (US)

(73) Assignee: Avago Technologies General IP (Singapore) Pte. Ltd., Singapore (SG)

(*) Notice: Subject to any disclaimer, the term of this patent is extended or adjusted under 35 U.S.C. 154(b) by 50 days.

(21) Appl. No.: 14/251,350

(22) Filed: Apr. 11, 2014

(65) Prior Publication Data

US 2015/0279421 A1    Oct. 1, 2015

Related U.S. Application Data

(60) Provisional application No. 61/971,813, filed on Mar. 28, 2014.

(51) Int. Cl.
  *G11B 20/18* (2006.01)
  *G11B 20/10* (2006.01)
  *H03M 13/11* (2006.01)

(52) U.S. Cl.
  CPC ...... *G11B 20/1833* (2013.01); *G11B 20/10046* (2013.01); *G11B 20/10509* (2013.01); *H03M 13/1142* (2013.01); *G11B 2020/185* (2013.01); *G11B 2020/1856* (2013.01); *G11B 2020/1863* (2013.01)

(58) Field of Classification Search
  CPC ............... H03M 13/1142; H03M 13/6331; H03M 13/1105; G11B 20/0046; G11B 20/10527; G11B 20/1883; G11B 2020/1856; G11B 2020/185; G11B 20/10203; G11B 20/10296; H04L 25/067
  USPC .......... 360/46, 25, 65; 714/799; 375/340, 341
  See application file for complete search history.

(56) References Cited

U.S. PATENT DOCUMENTS

| | | | |
|---|---|---|---|
| 8,332,718 B2 | 12/2012 | Scarpa et al. | |
| 8,578,253 B2* | 11/2013 | Yang et al. | 714/795 |
| 8,719,682 B2* | 5/2014 | Han et al. | 714/799 |
| 8,762,440 B2* | 6/2014 | Tan et al. | 708/322 |
| 8,781,033 B2* | 7/2014 | Han et al. | 375/340 |
| 8,839,009 B2* | 9/2014 | Yang et al. | 713/300 |
| 8,902,525 B1* | 12/2014 | Wilson et al. | 360/46 |
| 2013/0332794 A1 | 12/2013 | Yen et al. | |
| 2013/0339827 A1 | 12/2013 | Han et al. | |
| 2013/0343495 A1 | 12/2013 | Han et al. | |

* cited by examiner

*Primary Examiner* — Ali Neyzari
(74) *Attorney, Agent, or Firm* — Suiter Swantz pc llo

(57) ABSTRACT

A communication system and a noise predictive calibration method are disclosed. The communication system includes a decoder configured to decode an input signal, wherein the decoder produces one of: a converged data output when the decoder decodes the input signal successfully, and a non-converged data output when the decoder decodes the input signal unsuccessfully. The communication system also includes a convergence monitor configured to determine a calibration procedure based on at least one of: a number of times where the decoder decodes successfully, and a number of times where the decoder decodes unsuccessfully. A noise predictive calibration circuit is configured to utilize output produced by the decoder without qualification when the convergence monitor indicates utilization of a first calibration procedure. The noise predictive calibration circuit is further configured to utilize only the converged data output produced by the decoder when the convergence monitor indicates utilization of a second calibration procedure.

20 Claims, 3 Drawing Sheets

ADAPTIVE CALIBRATION OF NOISE PREDICTIVE FINITE IMPULSE RESPONSE FILTER BASED ON DECODER CONVERGENCE

CROSS-REFERENCE TO RELATED APPLICATIONS

The present application claims the benefit under 35 U.S.C. §119(e) of U.S. Provisional Application Ser. No. 61/971,813, filed Mar. 28, 2014. Said U.S. Provisional Application Ser. No. 61/971,813 is hereby incorporated by reference in its entirety.

TECHNICAL FIELD

The present invention relates to the field of signal processing and particularly to calibration of noise predictive finite impulse response filters.

BACKGROUND

Sectors of data from storage systems or other blocks of data may vary in the signal to noise ratio and thus in the difficulty of recovering the original data after storage or transmission. Noise predictive finite impulse response filters may be used to improve data detection of noisy data sectors.

SUMMARY

Accordingly, an embodiment of the present disclosure is directed to a communication system. The communication system includes a decoder configured to decode an input signal, wherein the decoder produces one of: a converged data output when the decoder decodes the input signal successfully, and a non-converged data output when the decoder decodes the input signal unsuccessfully. The communication system also includes a convergence monitor configured to determine a calibration procedure based on at least one of: a number of times where the decoder decodes successfully, and a number of times where the decoder decodes unsuccessfully. The communication system further includes a noise predictive calibration circuit configured to utilize output produced by the decoder without qualification when the convergence monitor indicates utilization of a first calibration procedure, the noise predictive calibration circuit further configured to utilize only the converged data output produced by the decoder when the convergence monitor indicates utilization of a second calibration procedure.

A further embodiment of the present disclosure is directed to a storage system. The storage system includes at least one storage device and a communication system in communication with the at least one storage device. The communication system includes a decoder configured to decode an input signal, wherein the decoder produces one of: a converged data output when the decoder decodes the input signal successfully, and a non-converged data output when the decoder decodes the input signal unsuccessfully. The communication system also includes a convergence monitor configured to determine a calibration procedure based on at least one of: a number of times where the decoder decodes successfully, and a number of times where the decoder decodes unsuccessfully. The communication system further includes a noise predictive calibration circuit configured to utilize output produced by the decoder without qualification when the convergence monitor indicates utilization of a first calibration procedure, the noise predictive calibration circuit further configured to utilize only the converged data output produced by the decoder when the convergence monitor indicates utilization of a second calibration procedure.

An additional embodiment of the present disclosure is directed to a noise predictive calibration method. The method includes: decoding an input signal to produce one of: a converged data output when the input signal is decoded successfully, and a non-converged data output when the input signal is decoded unsuccessfully; monitoring whether the input signal is decoded successfully; determining a calibration procedure based on at least one of: a number of times the input signal is decoded successfully, and a number of times the input signal is decoded unsuccessfully; providing noise predictive calibration utilizing data output regardless of whether the data output is converged or non-converged when the determined calibration procedure is a first calibration procedure; and providing noise predictive calibration utilizing only the converged data output when the determined calibration procedure is a second calibration procedure.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION

Reference will now be made in detail to the presently preferred embodiments of the invention, examples of which are illustrated in the accompanying drawings.

Principles of the present invention will be described herein in the context of illustrative embodiments of a noise predictive calibration and noise predictive finite impulse response filter loading techniques adapted to be employed in a read channel communications apparatus. It is to be appreciated, however, that the embodiments of the present invention are not limited to the specific apparatus and methods illustratively shown and described herein.

While illustrative embodiments of the invention will be described herein with reference to Low Density Parity Check (LDPC) and other error-correcting code (ECC) techniques, it is to be appreciated that the embodiments of the present invention are not limited to use with these particular techniques. Moreover, it will become apparent to those skilled in the art given the teachings herein that numerous modifications can be made to the embodiments shown that are within the scope of the present invention. That is, no limitations with respect to the specific embodiments described herein are intended or should be inferred.

Figure 1:
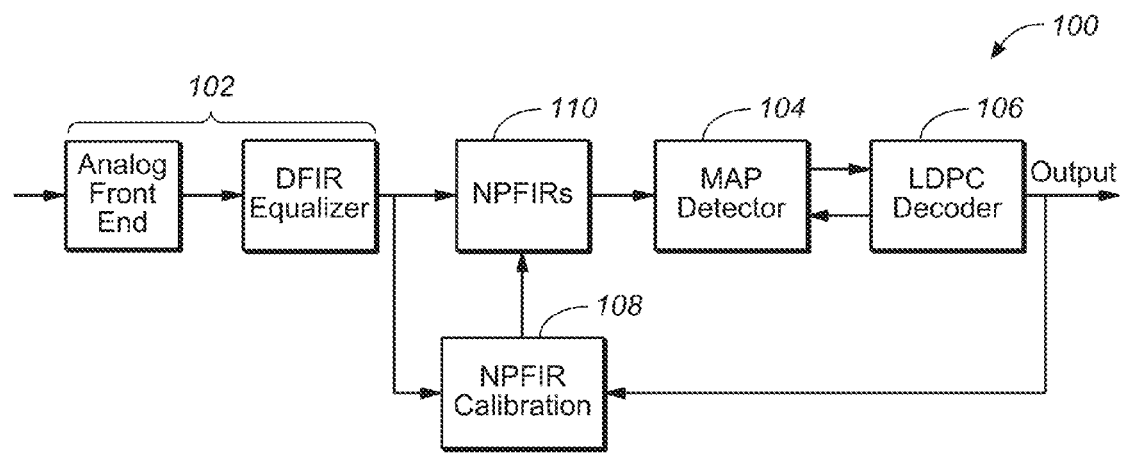
FIG. 1 is a block diagram depicting a communication system.

FIG. 1 is a block diagram depicting a read channel 100 for a storage device such as a hard disk drive (HDD) or the like. Data is retrieved from the storage medium in channel 102, where processing is performed on the data, such as amplification, analog-to-digital-conversion, finite impulse response (FIR) filtering, equalization and other processing techniques suitable for retrieving data from the medium. A detector 104 receives codewords from channel 102 and communicates with a decoder 106 to perform iterative decoding. The detectors can be implemented as soft-output Viterbi detectors, maximum a posteriori (MAP) detectors or the like, and the decoder(s) can be implemented as Low Density Parity Check (LDPC) decoders, Turbo decoders or the like.

In one embodiment of the present invention, the detector 104 is a noise predictive (NP) channel detector, well known in the art. As depicted in the figure, a noise predictive calibration circuit 108 is connected to a noise predictive finite impulse response filter (NPFIR) loading circuit 110 for loading filter coefficients into the detector 104. The noise predictive calibration circuit 108 calibrates or trains data to achieve filter coefficients, as data is being read, for the noise predictive filters in the detector 104. That is, the noise predictive calibration circuit 108 is adaptively processing so as to self adjust and continually update the coefficients for improved filtering of noise at the detector 104.

In an iterative decoding process such as that depicted in FIG. 1, the decoder 106 performs a data decoding process where the decoded data is either provided as a hard decision, or provided to the detector 104 again for a subsequent decoding iteration. Generally, where the data decoding process applied by the decoder 106 converges, the converged data is provided as a hard decision at the output and the processing is completed for that particular data set. The decoder 106 terminates when either (i) the decoder 106 arrives at a converged data/codeword, or (ii) the decoder 106 performs a maximum allowable number of iterations, or a maximum allowable time has elapsed, without arriving at a correctly decoded codeword, i.e., the decoder 106 has failed to converge. When the decoder 106 terminates under condition (i), the output of the decoder 106 is referred to as converged data. On the other hand, when the decoder 106 terminates under condition (ii), the output of the decoder 106 is referred to as non-converged data.

In general, it would be preferable for the noise predictive calibration circuit 108 to use error-free data (i.e., converged data from the decoder 106) for calibration and/or training purposes. Calibrating noise predictive finite impulse response filters with error-free decoded sectors is important since erroneous decoded sectors may cause divergence problems and the like. It is noted that, however, converged data is not always readily available, especially at the beginning stage of the calibration process. For instance, in the beginning stage of noise predictive calibration where the noise predictive finite impulse response filters are not reasonably well established, the decoded sectors rarely converges even at high signal to noise ratio regions.

Embodiments in accordance with the present invention are therefore configured to adaptively determine whether non-converged data output can be used for noise predictive calibration purposes. In one embodiment, a failure rate/count is monitored and compared against a programmable threshold to determine a calibration procedure as to whether non-converged data output can be used or not. For instance, if it is determined that the failure rate/count is high (e.g., in the beginning of NP calibration), the noise predictive calibration circuit 108 can be configured to operate under a first calibration procedure and accept output from the decoder 106 as its training data without any qualifications, regardless of whether the output from the decoder 106 is converged data or non-converged data. On the other hand, if it is determined that the failure rate/count is low (e.g., below the threshold value), the noise predictive calibration circuit 108 can be configured to operate under a second calibration procedure and only accept converged data from the decoder 106 as its training data, thus improving its accuracy.

Figure 2:
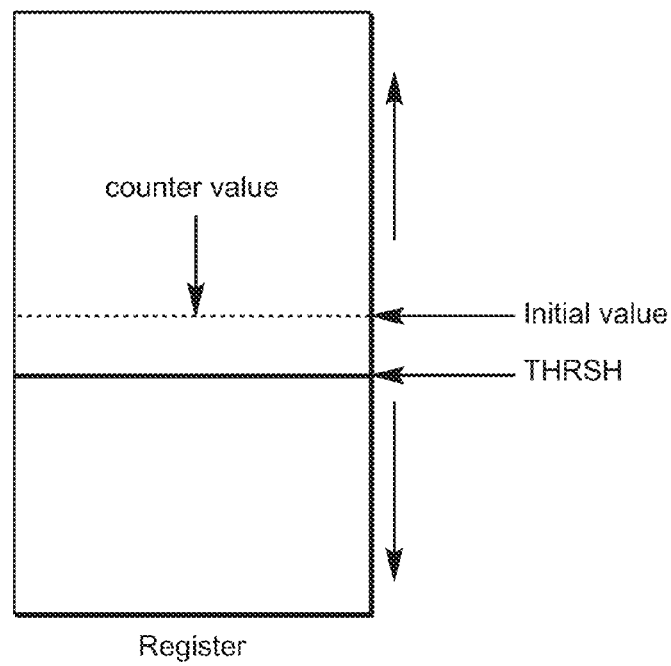
FIG. 2 is an illustration depicting a convergence monitor.

It is contemplated that various types of hardware components can be utilized to support monitoring of the failure rate/count. For instance, as depicted in FIG. 2, a failure counter register (e.g., a 4-bit counter) is used to track the pseudo sector failure rate. In the beginning of the calibration, a programmable threshold (denoted as THRSH in FIG. 2) can be established, and the counter can be set to its initial value (which by default can be half of the total counter capacity). The counter value will then increase or decrease based on sector convergence. For example, the counter can be decreased by 1 if the decoded sector is converged; otherwise, the counter can be increased by 1 if the decoded sector failed to converge. In this manner, if the counter value is greater than the threshold, it indicates that the failure count is high and the noise predictive calibration circuit 108 should accept output from the decoder 106 as its training data without any qualifications, regardless of whether the output from the decoder 106 is converged data or non-converged data. However, if the counter value is smaller than the threshold, it indicates that the failure count is low and the noise predictive calibration circuit 108 should only accept converged data from the decoder 106 for calibration.

It is contemplated that the counter as described above is merely exemplary. The counter can be inversed (i.e., a convergence counter) to achieve the same purpose. That is, the counter can be increased by 1 if the decoded sector is converged and decreased by 1 if the decoded sector failed to converge. In this manner, if the counter value is greater than the threshold, it indicates that the convergence count is high (i.e., failure count is low) and the noise predictive calibration circuit 108 should only accept converged data from the decoder 106 for calibration and vice versa. It is also contemplated that the increment/decrement unit of 1 as described above is merely exemplary. Different weight values can be assigned to converged and non-converged data, and such weight values can be adjusted over time as well without departing from the spirit and scope of the present invention. The threshold value can also be adjusted based on various conditions. Furthermore, the failure/success rate can be monitored as a percentage value, a ratio or the like, as long as the monitored value can be utilized to indicate the failure/success rate/count and whether the noise predictive calibration circuit 108 should accept output from the decoder 106 as its training data with or without any qualifications.

Figure 3:
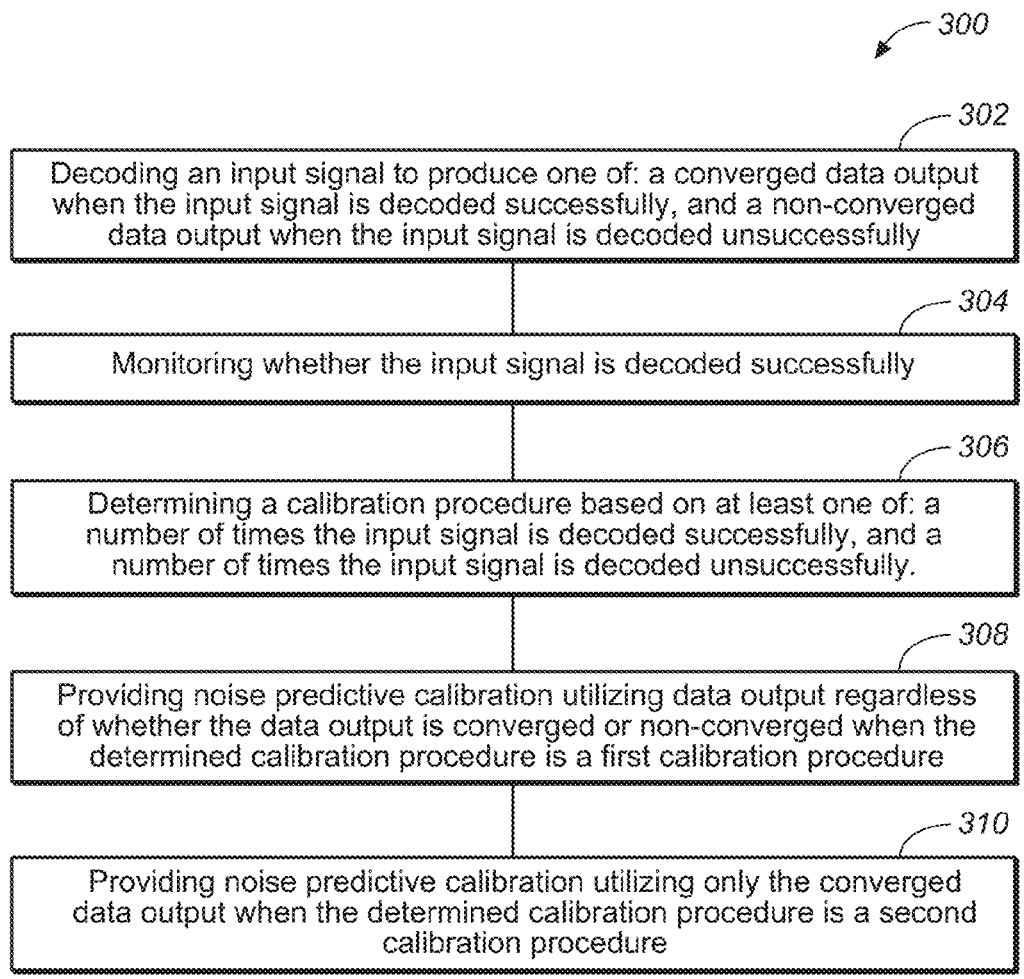
FIG. 3 is a flow diagram illustrating a noise predictive calibration method.

Referring now to FIG. 3, a flow diagram illustrating a noise predictive calibration method 300 is shown. As illustrated in FIG. 3, a decoder (e.g., a LDPC decoder) is utilized to decode an input signal in step 302. As described above, the decoder is configured to terminate when either (i) the decoder arrives at converged data, or (ii) the decoder fails to converge after an allowable number of iterations or a maximum allowable time has elapsed, and provides non-converged data. The termination conditions of the decoder are monitored in step 304, and the monitored result is compared against a threshold value in step 306 to determine a failure/success rate (may also be referred to as a convergence rate). If the failure rate is greater than the threshold (i.e., the success rate is lower than the threshold), the noise predictive calibration method proceeds to step 308 and accepts output from the decoder as training data without any qualifications, regardless of whether the output from the decoder is converged data or non-converged data. However, if the failure rate is lower than the threshold (i.e., the success rate is greater than the threshold), the noise predictive calibration method proceeds to step 310 and only accept converged data from the decoder for NP calibration.

Figure 4:
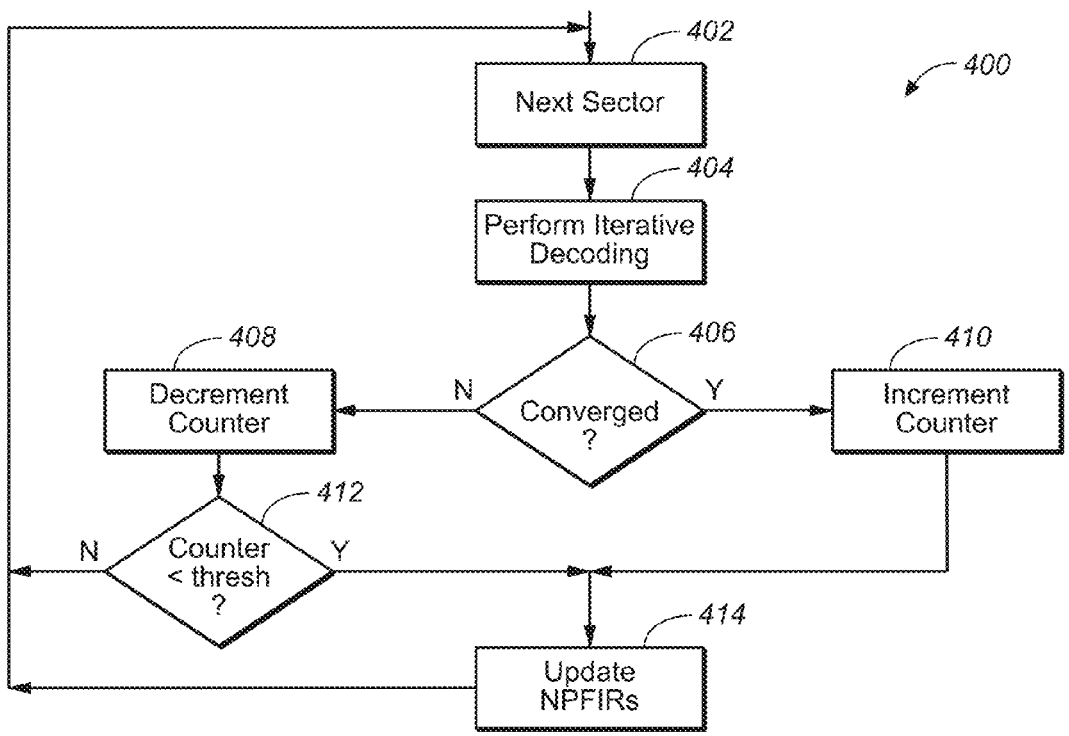
FIG. 4 is another flow diagram illustrating a noise predictive calibration method.

Referring now to FIG. 4, another flow diagram 400 illustrating the noise predictive calibration method described above is shown. As illustrated in FIG. 4, the decoder decodes each sector sequentially (steps 402 and 404), and the termination conditions of the decoder are monitored. If the decoder converged (determined in step 406), a convergence counter is incremented (step 410); otherwise, the convergence counter is decremented (step 408). If it is determined (step 412) that the convergence counter is less than a threshold (i.e., the success rate is lower than the threshold), the noise predictive calibration method continues to accept output from the decoder as training data without any qualifications, regardless of whether the output from the decoder is converged data or non-converged data. However, if the convergence counter is greater than the threshold (i.e., the success rate is greater than the threshold), the noise predictive calibration method should only accept converged data from the decoder for calibration and update the noise predictive finite impulse response filters accordingly (step 414).

It is contemplated that the structures and methods described above are applicable to various other types of communication systems in addition to read channel structures. For instance, the structures and methods can be generally applied to communication systems that require decoding, such as wireless and/or wired communication systems and the like.

It is also contemplated that the structures and methods described above can be utilized in a hard disk drive, a solid state drive, a hybrid drive, or a part of a higher level system, such as a RAID (redundant array of inexpensive storage devices or redundant array of independent storage devices) based storage system. Such a RAID storage system increases stability and reliability through redundancy, combining multiple storage devices as a logical unit. Data may be spread across a number of storage devices included in the RAID storage system according to a variety of algorithms and accessed by an operating system as if it were a single storage devices. For example, data may be mirrored to multiple storage devices in the RAID storage system, or may be sliced and distributed across multiple storage devices in a number of techniques. If a small number of storage devices in the RAID storage system fail or become unavailable, error correction techniques may be used to recreate the missing data based on the remaining portions of the data from the other storage devices in the RAID storage system. The storage devices in the RAID storage system may be, but are not limited to, individual storage systems such hard disk drives, solid state drives, hybrid drives or any combination of such drives, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

As mentioned previously, the storage device configuration can be varied in other embodiments of the invention. For example, the storage device may comprise a hybrid hard disk drive which includes a flash memory in addition to one or more storage disks. In addition, storage device may be coupled to or incorporated within a host processing device, which may be a computer, server, communication device, etc.

Figure 5:
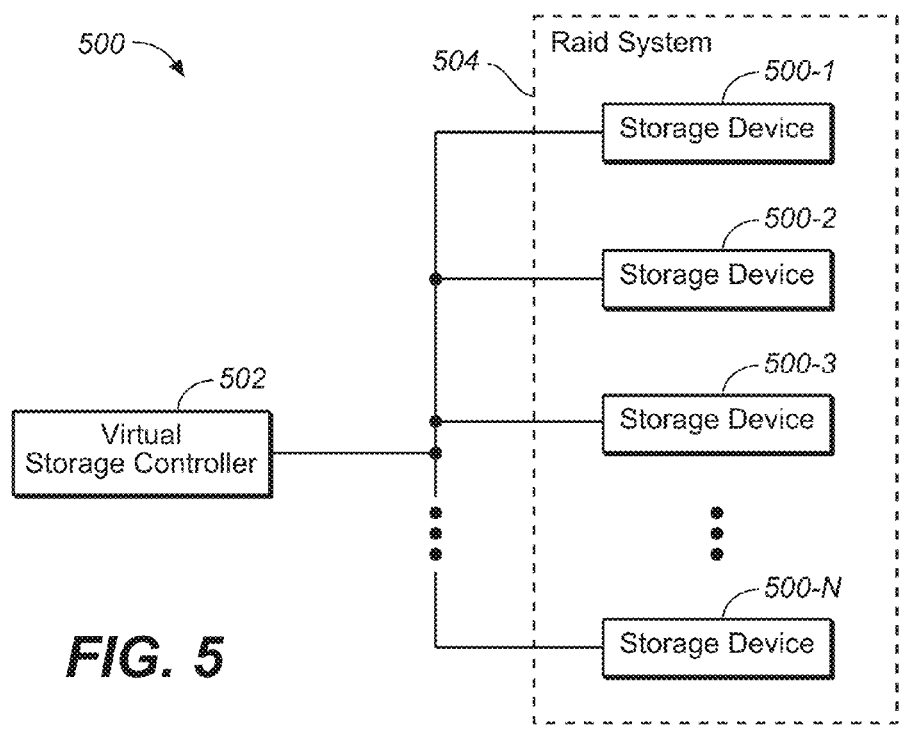
FIG. 5 is a block diagram depicting a storage system.

Furthermore, multiple storage devices 500-1 through 500-N possibly of various different types may be incorporated into a virtual storage system 500 as illustrated in FIG. 5 The virtual storage system 500, also referred to as a storage virtualization system, illustratively comprises a virtual storage controller 502 coupled to a RAID system 504. The RAID system more specifically comprises N distinct storage devices denoted 500-1, 500-2, . . . 500-N, one or more of which may be hard disk drives and one or more of which may be solid state drives. Furthermore, one or more of the hard disk drives of the RAID system are assumed to be configured to include read channel circuitry and associated decoding circuitry as disclosed herein. These and other virtual storage systems comprising hard disk drives or other storage devices are considered embodiments of the invention.

Embodiments of the invention may also be implemented in the form of integrated circuits. In a given such integrated circuit implementation, identical die are typically formed in a repeated pattern on a surface of a semiconductor wafer. Each die includes, for example, at least a portion of decoding circuitry as described herein, and may further include other structures or circuits. The individual die are cut or diced from the wafer, then packaged as an integrated circuit. One skilled in the art would know how to dice wafers and package die to produce integrated circuits. Integrated circuits so manufactured are considered embodiments of the invention.

It should again be emphasized that the above-described embodiments of the invention are intended to be illustrative only. For example, other embodiments can use different types and arrangements of storage disks, read/write heads, read channel circuitry, signal processing circuitry, decoders, filters, detectors, and other storage device elements for implementing the described error correction functionality. Also, the particular manner in which certain steps are performed in the signal processing may vary. Further, although embodiments of the invention have been described with respect to storage disks such as hard disk drives, embodiments of the invention may be implemented various other devices including optical data-storage applications and wireless communications. These and numerous other alternative embodiments within the scope of the following claims will be apparent to those skilled in the art.

Furthermore, embodiments of the invention are applicable to any communication channel that employs low density parity check technology (LDPC). LDPC technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes, optical data-storage, and memory devices such as DRAM, NAND flash, NOR flash, other non-volatile memories, solid state drives, and hybrid drives.

It is understood that the specific order or hierarchy of steps in the foregoing disclosed methods are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A communication system, comprising:
   a decoder configured to decode an input signal, wherein the decoder produces one of: a converged data output when the decoder decodes the input signal successfully, and a non-converged data output when the decoder decodes the input signal unsuccessfully;
   a convergence monitor configured to determine a calibration procedure based on at least one of: a number of times where the decoder decodes successfully, and a number of times where the decoder decodes unsuccessfully; and
   a noise predictive calibration circuit configured to utilize output produced by the decoder without qualification when the convergence monitor indicates utilization of a first calibration procedure, the noise predictive calibration circuit further configured to utilize only the converged data output produced by the decoder when the convergence monitor indicates utilization of a second calibration procedure.

2. The communication system of claim 1, wherein the convergence monitor includes a counter for tracking at least one of: the number of times where the decoder decodes successfully, and the number of times where the decoder decodes unsuccessfully.

3. The communication system of claim 2, wherein the counter is at least one of: increased and decreased based on whether the decoder decodes successfully.

4. The communication system of claim 3, wherein the convergence monitor determines the calibration procedure based on comparison between the counter and a threshold value.

5. The communication system of claim 3, wherein an initial value of the counter in comparison with the threshold value indicates utilization of the first calibration procedure, wherein the output produced by the decoder is utilized without qualification.

6. The communication system of claim 1, wherein the decoder, the convergence monitor and the noise predictive calibration circuit are fabricated in an integrated circuit.

7. The communication system of claim 1, wherein the decoder implements at least one low density parity check decoder.

8. A storage system, comprising:
   at least one storage device; and
   a communication system in communication with the at least one storage device, the communication system further comprising:
      a decoder configured to decode an input signal, wherein the decoder produces one of: a converged data output when the decoder decodes the input signal successfully, and a non-converged data output when the decoder decodes the input signal unsuccessfully;
      a convergence monitor configured to determine a calibration procedure based on at least one of: a number of times where the decoder decodes successfully, and a number of times where the decoder decodes unsuccessfully; and
      a noise predictive calibration circuit configured to utilize output produced by the decoder without qualification when the convergence monitor indicates utilization of a first calibration procedure, the noise predictive calibration circuit further configured to utilize only the converged data output produced by the decoder when the convergence monitor indicates utilization of a second calibration procedure.

9. The storage system of claim 8, wherein the convergence monitor includes a counter for tracking at least one of: the number of times where the decoder decodes successfully, and the number of times where the decoder decodes unsuccessfully.

10. The storage system of claim 9, wherein the counter is at least one of:
    increased and decreased based on whether the decoder decodes successfully.

11. The storage system of claim 10, wherein the convergence monitor determines the calibration procedure based on comparison between the counter and a threshold value.

12. The storage system of claim 11, wherein an initial value of the counter in comparison with the threshold value indicates utilization of the first calibration procedure, wherein the output produced by the decoder is utilized without qualification.

13. The storage system of claim 8, wherein the communication system is a read channel for the at least one storage device.

14. The storage system of claim 8, wherein the decoder, the convergence monitor and the noise predictive calibration circuit are fabricated in an integrated circuit.

15. The storage system of claim 8, wherein the at least one storage device forms a redundant array of independent storage devices (RAID) storage system.

16. The storage system of claim 8, wherein the decoder implements at least one low density parity check decoder.

17. A noise predictive calibration method, comprising:
    decoding an input signal to produce one of: a converged data output when the input signal is decoded successfully, and a non-converged data output when the input signal is decoded unsuccessfully;
    monitoring whether the input signal is decoded successfully;
    determining a calibration procedure based on at least one of: a number of times the input signal is decoded successfully, and a number of times the input signal is decoded unsuccessfully;
    providing noise predictive calibration utilizing data output regardless of whether the data output is converged or non-converged when the determined calibration procedure is a first calibration procedure; and
    providing noise predictive calibration utilizing only the converged data output when the determined calibration procedure is a second calibration procedure.

18. The method of claim 17, wherein monitoring whether the input signal is decoded successfully includes:
    increasing or decreasing a counter based on whether the input signal is decoded successfully.

19. The method of claim 18, wherein determining a calibration procedure includes:
    comparing the counter to a threshold value.

20. The method of claim 17, wherein the noise predictive calibration method is implemented on a storage device.

* * * * *